(12) United States Patent
Yang (10) Patent No.: US 7,160,791 B2
(45) Date of Patent: Jan. 9, 2007

(54) BATCH PROCESS AND DEVICE FOR FORMING SPACER STRUCTURES FOR PACKAGING OPTICAL REFLECTION DEVICES

(75) Inventor: Xiao Charles Yang, Cupertino, CA (US)

(73) Assignee: Miradia Inc., Sunnyvale, CA (US)

( * ) Notice: Subject to any disclaimer, the term of this patent is extended or adjusted under 35 U.S.C. 154(b) by 178 days.

(21) Appl. No.: 10/931,149

(22) Filed: Aug. 30, 2004

(65) Prior Publication Data

US 2006/0046430 A1    Mar. 2, 2006

(51) Int. Cl.
*H01L 21/00* (2006.01)

(52) U.S. Cl. .............................. 438/455; 257/E21.122; 438/52

(58) Field of Classification Search .................. 438/52, 438/455; 257/E21.122
See application file for complete search history.

(56) References Cited

U.S. PATENT DOCUMENTS 6,001,666 A * 12/1999 Diem et al. .................... 438/52

* cited by examiner

Primary Examiner—Asok Kumar Sarkar
(74) Attorney, Agent, or Firm—Townsend and Townsend and Crew LLP (57) ABSTRACT

A method for forming a standoff structure for packaging devices, e.g., optical devices, integrated circuit devices. The method includes providing a substrate, e.g., silicon wafer. The substrate includes a first surface region, a second surface region, and a thickness defined between the first surface region and the second surface region. The method includes protecting selected portions of the first surface region using a masking layer while leaving a plurality of unprotected regions. Preferably, each of the unprotected regions is to be associated with an opening through the thickness of the substrate. The method causes removal of the plurality of unprotected regions to form a plurality of openings through the thickness of the substrate to provide a resulting patterned substrate. Each of the openings is bordered by a portion of the selected portions of the first surface region. Preferably, etching techniques, such as wet etch or dry etching, can be used, depending upon the embodiment. The method removes the masking layer via ashing or stripping. In a specific embodiment, the method further includes bonding a handle substrate to the patterned substrate. Preferably, the handle substrate is optically transparent. Each of the openings is bordered by a portion of the handle substrate to form a recessed region.

26 Claims, 10 Drawing Sheets

BATCH PROCESS AND DEVICE FOR FORMING SPACER STRUCTURES FOR PACKAGING OPTICAL REFLECTION DEVICES

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates generally to packaging techniques. More particularly, the invention includes a method and structure for packaging optical devices using wet processing techniques for bonded substrates. Merely by way of example, the invention has been applied to integrating a mechanical based structure with an integrated circuit chip. But it would be recognized that the invention has a much broader range of applicability.

Visual display technologies have rapidly developed over the years. Most particularly, electronic displays for outputting television shows, streaming video, and the like. From the early days, cathode ray tube technology, commonly called CRTs, outputted selected pixel elements onto a glass screen in conventional television sets. These television sets originally output black and white moving pictures. Color television sets soon replaced most if not all black and white television units. Although very successful, CRTs were often bulky, difficult to make larger, and had other limitations.

CRTs were soon replaced, at least in part, with liquid crystal panel displays. These liquid crystal panel displays commonly called LCDs used an array of transistor elements coupled to a liquid crystal material and color filter to output moving pictures in color. Many computer terminals and smaller display devices often relied upon LCDs to output video, text, and other visual features. Unfortunately, liquid crystal panels often had low yields and were difficult to scale up to larger sizes. These LCDs were often unsuitable for larger displays often required for television sets and the like.

Accordingly, projection display units have been developed. These projection display units include, among others, a counterpart liquid crystal display, which outputs light from selected pixel elements through a lens to a larger display to create moving pictures, text, and other visual images. Another technology is called "Digital Light Processing" (DLP), which is a commercial name from Texas Instruments Incorporated (TI) of Texas, USA. DLP is often referred to as the use of "micro-mirrors." DLP relies upon a few hundred thousand tiny mirrors, which line up in 800 rows of 600 mirrors each. Each of the mirrors is hinged. An actuator is attached to each of the hinges. The actuator is often electrostatic energy that can tilt each of the mirrors at high frequency. The moving mirrors can modulate light, which can be transmitted through a lens and then displayed on a screen. Although DLP has been successful, it is often difficult to manufacture and subject to low yields, etc. DLP is also manufactured using MEMS based processing techniques. Such MEMS based processing technique is often costly and difficult to scale up for efficient processing. More specifically, packaging techniques used for MEMS are also difficult and costly to scale up.

From the above, it is seen that an improved technique for packaging devices is desired.

BRIEF SUMMARY OF THE INVENTION

According to the present invention, techniques for packaging optical devices are provided. More particularly, the invention includes a method and structure for packaging optical devices using wet processing techniques for bonded substrates. Merely by way of example, the invention has been applied to integrating a mechanical based structure with an integrated circuit chip. But it would be recognized that the invention has a much broader range of applicability.

In a specific embodiment, the present invention provides a method for forming patterned silicon materials for use in packaging optical devices or other like devices, e.g., integrated circuits. The method includes providing a silicon substrate (e.g., silicon wafer) having a first surface region and a second surface region, a thickness of material defined between the first surface region and the second surface region. The method includes protecting first selected regions on the first surface region using a first masking layer. The method also includes protecting second selected regions using a second masking layer. Each of the second selected regions faces each of the first selected regions. The method includes removing first unprotected regions on the first surface and removing second unprotected regions on the second surface to cause removal of a portion the thickness of material in the first unprotected regions and the second unprotected regions to form through a plurality of openings formed in the first unprotected regions and the second unprotected regions. In a specific embodiment, the removal can occur using wet etching techniques and/or dry etching techniques, depending upon the embodiment. Preferably, the first protected selected regions and the second protected selected regions define standoff structures. The method includes removing the first masking layer and removing the second masking layer to form a patterned silicon substrate. The method includes bonding the patterned silicon substrate to a handle substrate.

In an alternative specific embodiment, the present invention provides an alternative method for forming patterned silicon materials for use in packaging optical devices or other like devices, e.g., integrated circuits. The method includes providing a silicon substrate (e.g., silicon wafer) having a first surface region and a second surface region, a thickness of material defined between the first surface region and the second surface region. The method includes protecting first selected regions on the first surface region using a first masking layer. The method also includes protecting second selected regions using a second masking layer, each of the second selected regions facing each of the first selected regions, on the second surface region. The method includes removing first unprotected regions on the first surface and removing second unprotected regions on the second surface to cause removal of a portion the thickness of material in the first unprotected regions and the second unprotected regions to form through a plurality of openings formed in the first unprotected regions and the second unprotected regions. In a specific embodiment, the removal can occur using wet etching techniques and/or dry etching techniques, depending upon the embodiment. Preferably, the first protected selected regions and the second protected selected regions define standoff structures. The method includes removing the first masking layer and removing the second masking layer to form a patterned silicon substrate. Preferably, the method bonds a first face of the first surface region of the patterned silicon substrate to a handle substrate to form a plurality of recessed regions defined respectively by the plurality of openings. Each of the plurality of recessed regions has a portion of the handle substrate acting as a border region. Preferably, the handle substrate is optically transparent and is made of a glass or glass type material. The method also bonds a second face of the second surface region of the patterned silicon substrate to a device substrate. Preferably, each of the recessed regions faces at least one chip to enclose the chip with a portion of the patterned silicon substrate.

In yet a further alternative embodiment, the present invention provides a method for forming a standoff structure for packaging devices, e.g., optical devices, integrated circuit devices. The method includes providing a substrate, e.g., silicon wafer. The substrate includes a first surface region, a second surface region, and a thickness defined between the first surface region and the second surface region. The method includes protecting selected portions of the first surface region using a masking layer while leaving a plurality of unprotected regions. Preferably, each of the unprotected regions is to be associated with an opening through the thickness of the substrate. The method causes removal of the plurality of unprotected regions to form a plurality of openings through the thickness of the substrate to provide a resulting patterned substrate. Each of the openings is bordered by a portion of the selected portions of the first surface region. Preferably, etching techniques, such as wet etch or dry etching, can be used, depending upon the embodiment. The method removes the masking layer via ashing or stripping. In a specific embodiment, the method further includes bonding a handle substrate to the patterned substrate. Preferably, the handle substrate is optically transparent. Each of the openings is bordered by a portion of the handle substrate to form a recessed region.

Many benefits are achieved by way of the present invention over conventional techniques. For example, the present technique provides an easy to use process that relies upon conventional technology. In some embodiments, the method provides higher device yields for the bonded substrates. Additionally, the method provides a process that is compatible with conventional process technology without substantial modifications to conventional equipment and processes. Preferably, the invention provides for an improved integrated structure including integrated circuits and mirror structures for display applications. In preferred embodiments, the present method provides a batch process, which can produce high throughput and yields. Using the present chemical etching processes, which are highly selectively, physical damage and/or defects are minimized or even reduced. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for packaging optical devices are provided. More particularly, the invention includes a method and structure for packaging optical devices using wet processing techniques for bonded substrates. Merely by way of example, the invention has been applied to integrating a mechanical based structure with an integrated circuit chip. But it would be recognized that the invention has a much broader range of applicability.

A method for packaging optical devices according to an embodiment of the present invention may be outlined as follows:

1. Provide a substrate, e.g., silicon wafer, which has a first surface region, a second surface region, and a thickness defined between the first surface region and the second surface region;
2. Protect selected portions of the first surface region using a masking layer;
3. Leave a plurality of unprotected regions exposed from the masking layer;
4. Cause removal via etching of the plurality of unprotected regions to form a plurality of openings through the thickness of the substrate to provide a resulting patterned substrate;
5. Remove the masking layer via ashing or stripping;
6. Plasma activate surfaces of substrate;
7. Bond a handle substrate to the patterned substrate to form a plurality of recessed regions corresponding to the plurality of openings and a plurality of border regions respectively surrounding the plurality of recessed regions;
8. Perform bond treatment;
9. Plasma activate surfaces of bonded substrate and device substrate;
10. Bond the plurality of border regions to the device substrate, including a plurality of chips, such that each of the recessed regions is formed respectively over at least one of the chips;
11. Perform bond treatment; and
12. Perform other steps, as desired.

The above sequence of steps provides a method for packaging a optical device according to an embodiment of the present invention. As shown, the method uses a combination of steps including a way of forming a plurality of silicon structures that form standoff regions to be bonded to a device substrate according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

Figure 1:
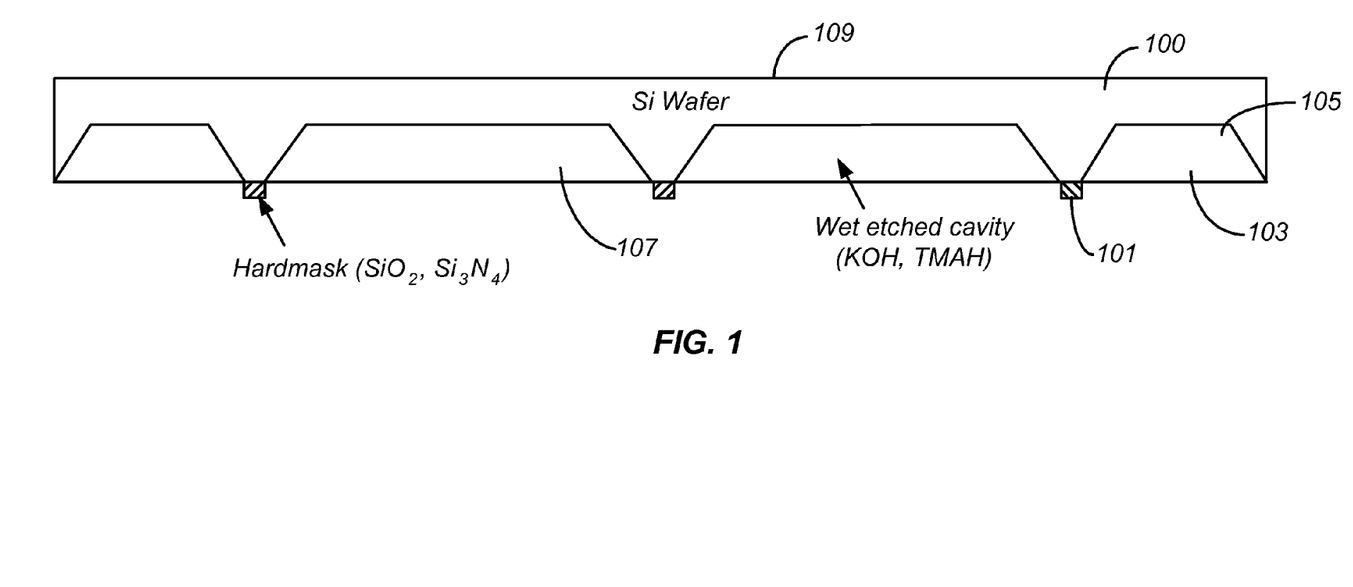
FIGS. 1 through 2 are simplified cross-sectional view diagrams illustrating methods for forming a standoff structure for packaging an optical device according to embodiments of the present invention.
Figure 2:
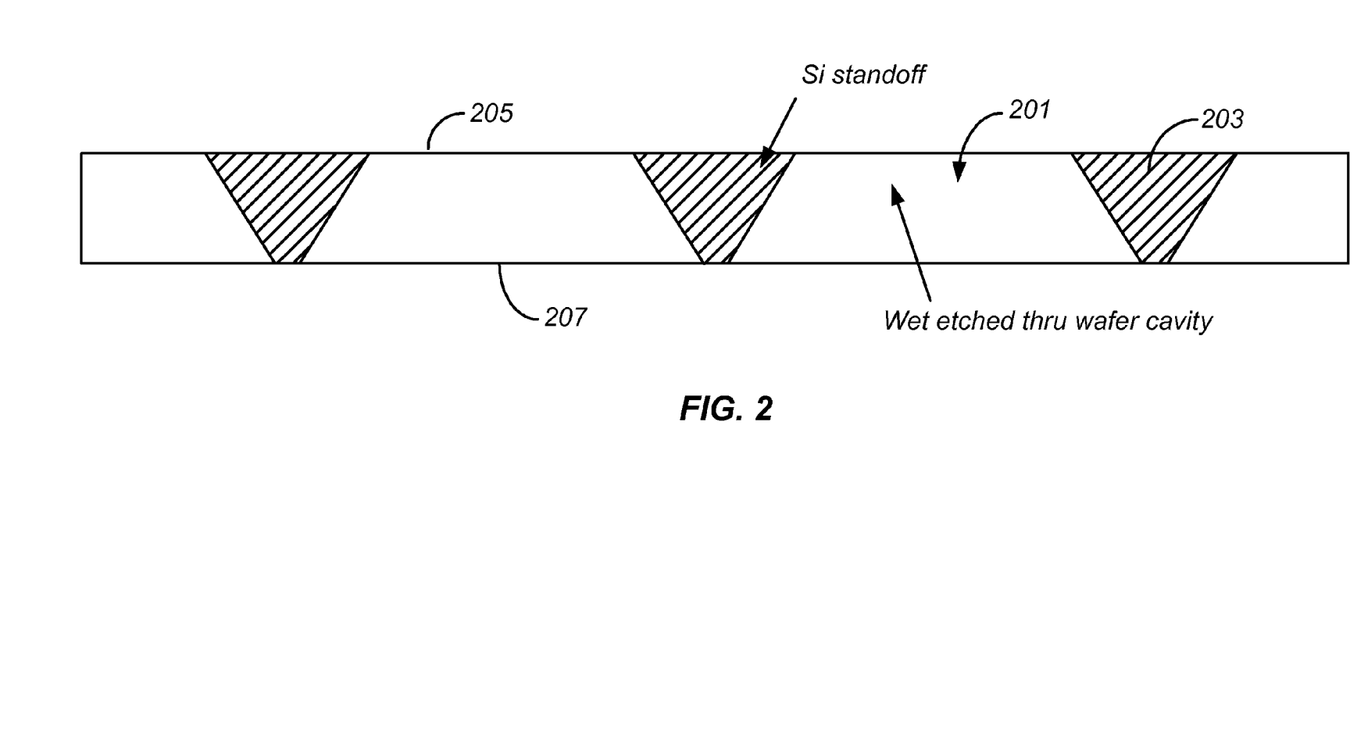

FIGS. 1 through 2 are simplified cross-sectional view diagrams illustrating methods for forming standoff structures for use in packaging an optical device according to embodiments of the present invention. These diagrams are merely examples, which should not unduly limit the scope of the claims herein. One of ordinary skill in the art would recognize many variations, alternatives, and modifications. As shown, the present invention provides a method for forming a standoff structure for packaging devices, e.g., optical devices, integrated circuits, MEMS. The method includes providing a substrate 100, e.g., silicon wafer, silicon on insulator. The substrate including a first surface region 107, a second surface region 109, and a thickness (e.g., 725 microns for 8 inch wafers) defined between the first surface region and the second surface region. The method includes protecting 101 selected portions of the first surface region using a masking layer while leaving a plurality of unprotected regions. Preferably, the masking layer is a hard mask made of silicon dioxide, silicon nitride, or a combination of these, among other materials. Preferably, the hard mask may be ½ micron to a couple of microns for oxide layers, depending upon the embodiment. Preferably, each of the unprotected region to be associated with an opening through the thickness of the substrate. The method includes causing removal of the plurality of unprotected regions 103. According to a specific embodiment, wet etching techniques can be used to form etched region 105. Preferably, etching occurs using potassium hydroxide, TMAH, or like etchants, depending upon the embodiment. The etched region forms a pattern along a 111 crystal orientation of silicon. As shown, the etched region is provided at an angle 54.74° from a normal to the first surface region. Other techniques may rely upon dry etching. Dry etching techniques yield a substantially vertical sidewall region, while wet etching occurs along a crystal plane, which would be shaped in an angle, according to the present invention.

Figure 6:
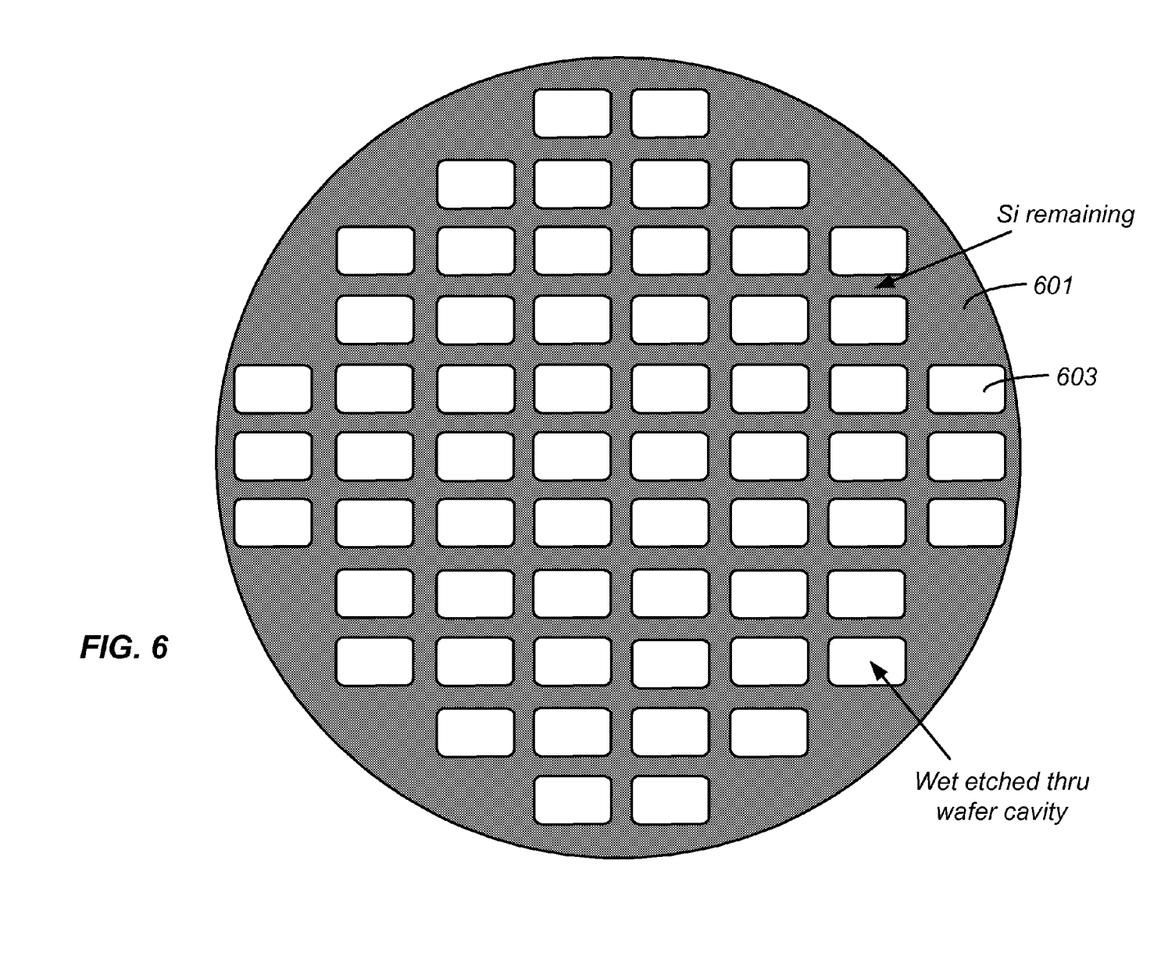

Referring to FIG. 2, the method forms a plurality of openings 201 through the thickness of the substrate to provide a resulting patterned substrate 203. Each of the openings is bordered by a portion of the selected portions of the first surface region. The substrate includes a patterned first surface region 207 and a patterned second surface region 205. Next, the method removes the masking layer. Preferably, stripping or ashing occurs to remove the masking layer. The masking layer is removed using a selective etch such as an buffered oxide etch (BOE) or hydrofluoric acid (HF) dip for an oxide hard mask, which maintains a clean and damage free silicon surface. As merely an example, a top-view illustration of the patterned substrate is provided in FIG. 6, although other illustrations can exist. The method also bonds a handle substrate to the patterned substrate. Preferably, the handle substrate is transparent. Each of the openings is bordered by a portion of the handle substrate to form a recessed region. Further details of the process will be described throughout the present specification and more particularly below.

As noted, the above sequence of steps provides a method for packaging a optical device according to an embodiment of the present invention. As shown, the method uses a combination of steps including a way of forming a plurality of silicon structures that form standoff regions to be bonded to a device substrate according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

A method for packaging optical devices according to an alternative embodiment of the present invention may be outlined as follows:

1. Provide a silicon substrate (e.g., silicon wafer) having a first surface region and a second surface region, a thickness of material defined between the first surface region and the second surface region;
2. Protect first selected regions on the first surface region using a first masking layer;
3. Protect second selected regions using a second masking layer, where each of the second selected regions facing each of the first selected regions on the second surface region;
4. Remove first unprotected regions on the first surface;
5. Remove second unprotected regions on the second surface (simultaneously with step 4);
6. Cause removal of a portion the thickness of material in the first unprotected regions and the second unprotected regions to form through a plurality of openings formed in the first unprotected regions and the second unprotected regions to define standoff structures;
7. Remove the first masking layer;
8. Remove the second masking layer;
9. Provide patterned silicon substrate;
10. Bond a first face of the first surface region of the patterned silicon substrate to a handle substrate to form a plurality of recessed regions defined respectively by the plurality of openings;
11. Bond a second face of the second surface region of the patterned silicon substrate to a device substrate; and
12. Perform other steps, as desired.

The above sequence of steps provides a method for packaging a optical device according to an embodiment of the present invention. As shown, the method uses a combination of steps including a way of forming a plurality of silicon structures that form standoff regions to be bonded to a device substrate according to an embodiment of the present invention. The present method provides a way of etching from each side of the substrate to reduce etching time and also reduces any sharp corners associated with a certain single sided etching process. Other alternatives can also be provided where steps are added, one or more steps are removed, or one or more steps are provided in a different sequence without departing from the scope of the claims herein. Further details of the present method can be found throughout the present specification and more particularly below.

FIGS. 3 through 9 are simplified cross-sectional view diagrams illustrating methods for packaging an optical device according to embodiments of the present invention. These diagrams are merely examples, which should not unduly limit the scope of the claims herein. One of ordinary skill in the art would recognize many variations, alternatives, and modifications. Like reference numerals are used in these diagrams as the prior diagrams but are not intended to be limiting the scope of the invention claimed herein. As shown, the invention provides a method for forming patterned silicon materials for use in packaging optical device or other like devices, e.g., integrated circuits, MEMS. The method includes providing a silicon substrate 301 having a first surface region 303, a second surface region 305, and a thickness of material defined between the first surface region and the second surface region. Preferably, the substrate is a silicon wafer, silicon on insulator wafer, or other types of wafers or substrates. The method includes protecting 302 first selected regions on the first surface region using a first masking layer. Preferably, the first masking layer is made of a hard mask material such as silicon dioxide, silicon nitride, other like materials, and any combination of these. The method also includes protecting second selected regions 307 on the second surface region using a second masking layer. Preferably, the second selected regions face the first selected regions. Exposed regions 303 are also included. Preferably, the second masking layer is made of a hard mask material such as silicon dioxide, silicon nitride, other like materials, and any combination of these. Referring to FIG. 3A, a top-view illustration of a portion of substrate 300 is shown. The substrate includes exposed region 305, which will be removed, and protected regions 307. The protected regions include the masking layer, which protects the underlying silicon material.

Figure 3:
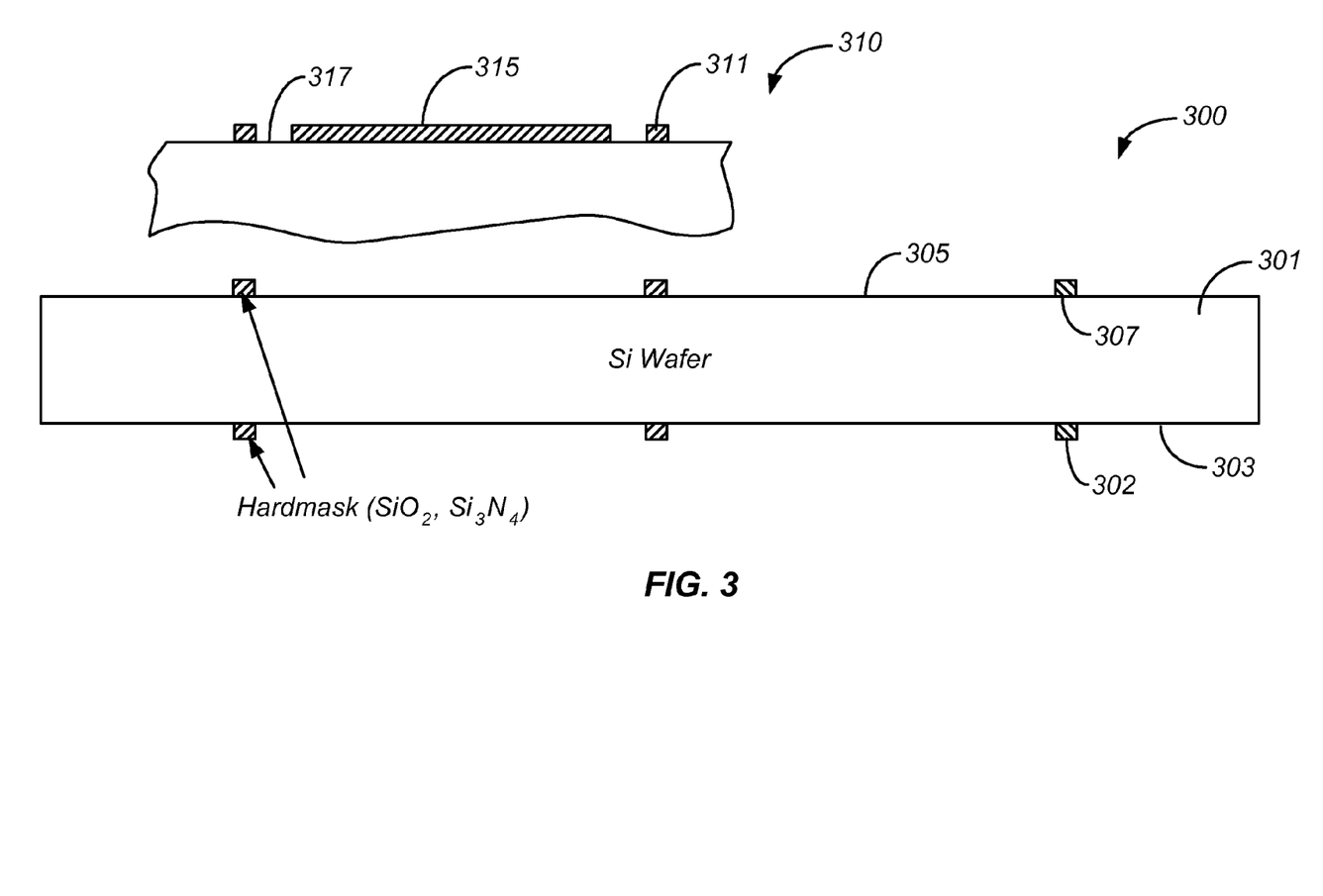
FIGS. 3 through 9 are simplified cross-sectional view diagrams illustrating alternative methods for forming a standoff structure for packaging an optical device according to embodiments of the present invention.
Figure 3A:
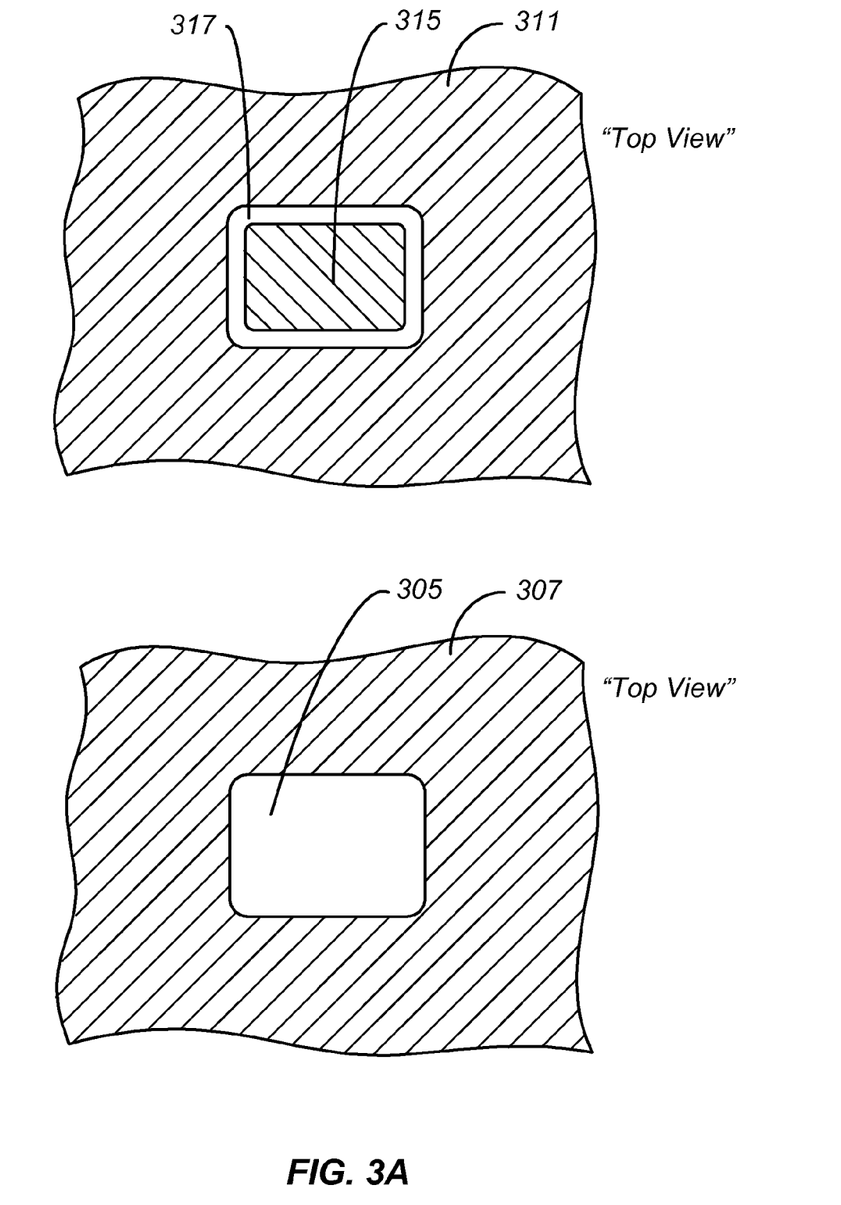
FIG. 3A is a simplified top-view diagram of a masked structure of FIG. 3 according to an embodiment of the present invention.

In yet an alternative specific embodiment, the silicon substrate 310 includes protected regions 315 and 311, as illustrated by FIG. 3. Region 315 will eventually be removed via etching by creating a portion of substrate material, which is released. Region 311 is also protects the substrate. Exposed region 317 is shaped as a ring-type or trench type region, which will be etched out. Preferably, the exposed region has a race track type structure. Referring to FIG. 3A, protected region 315 and 311 are shown. Exposed region 317 is also shown. The exposed region will be subjected to etching, which will chemically remove the exposed region through an entirety of the thickness of the substrate. Region 315, which is not supported, once etching has been finished, drops out and is removed physically. By way of protecting region 315, the present embodiment consumes less etching species and is not subject to "loading" issues in the etching species. Additionally, the present embodiment may be more efficient and may have higher throughput than the prior embodiment illustrated by reference numeral 300. Of course, one of ordinary skill in the art would recognize many variations, modifications, and alternatives.

Figure 4:
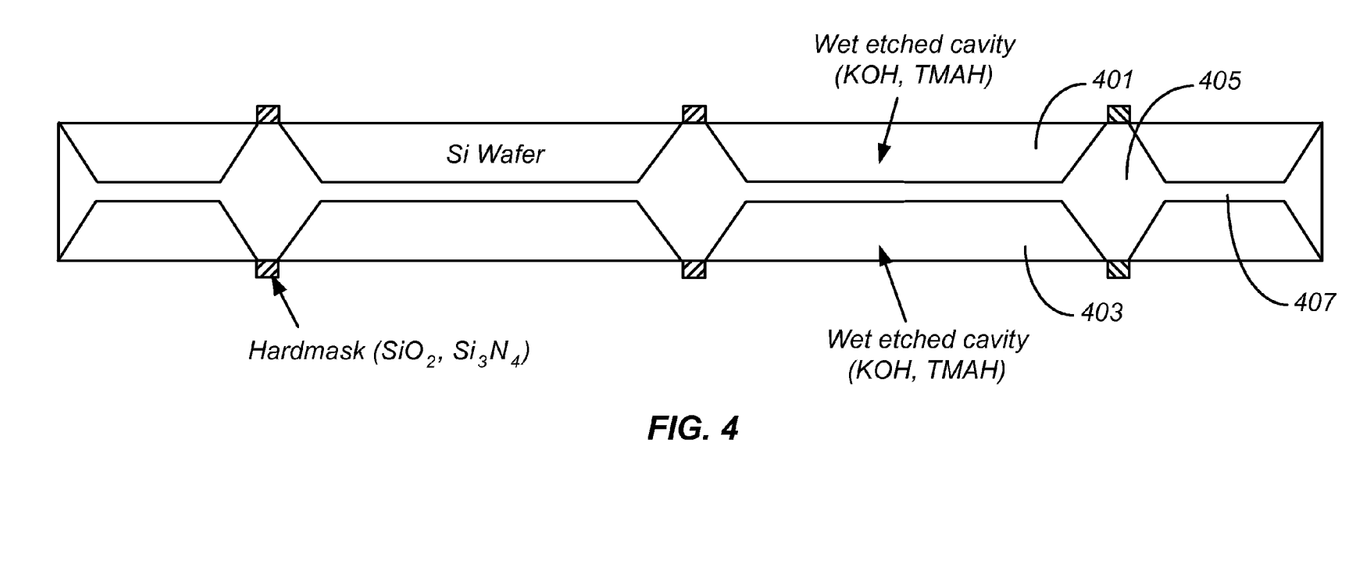

Referring now to FIG. 4, the method removes 403 first unprotected regions on the first surface and removes 401 second unprotected regions on the second surface. Here, removal occurs on a portion the thickness of material in the first unprotected regions and the second unprotected regions while maintaining protected region 405. Preferably, removal of the first unprotected regions and the removal of the second unprotected regions are performed simultaneously. In a preferred embodiment, the removal of the first unprotected regions and the removing the second unprotected regions are provided using a wet etching process. The wet etching process can use a suitable chemistry such as potassium hydroxide (KOH), tetramethylammonium hydroxide (TMAH), or other suitable etching materials, including dry etching techniques. Dry etching techniques yield a substantially vertical sidewall region, while wet etching occurs along a crystal plane, which would be shaped in an angle, according to the present invention. Of course, one of ordinary skill in the art would recognize many variations, modifications, and alternatives.

Figure 5:
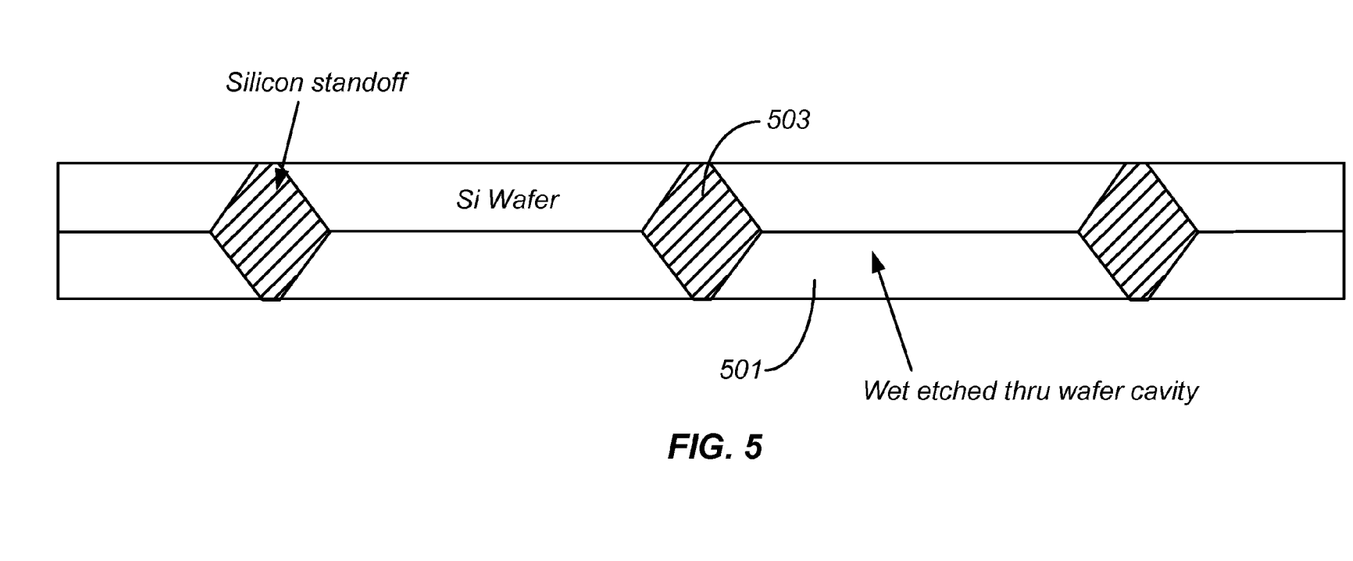

Referring to FIG. 5, the method forms a plurality of openings 501 in the first unprotected regions and the second unprotected regions. As shown, the openings connected the first and second regions to each other through the thickness of silicon material. The method maintains silicon material 503 in protected regions. Such silicon material will serve as the standoff regions. Such standoff regions include portions on each side of the silicon material. The portions are free from any sharp corner regions, which may break off or cause other difficulties during subsequent bonding processes. The method removes the first masking layer and removes the second masking layer to form a patterned silicon substrate. A top-view illustration of the patterned silicon material is provided by way of FIG. 6. As shown, the patterned silicon material includes standoff region 601 and a plurality of openings 603. Depending upon the embodiment, the top-view illustration for the above and other embodiments may look similar or the same depending upon the embodiment.

Figure 7:
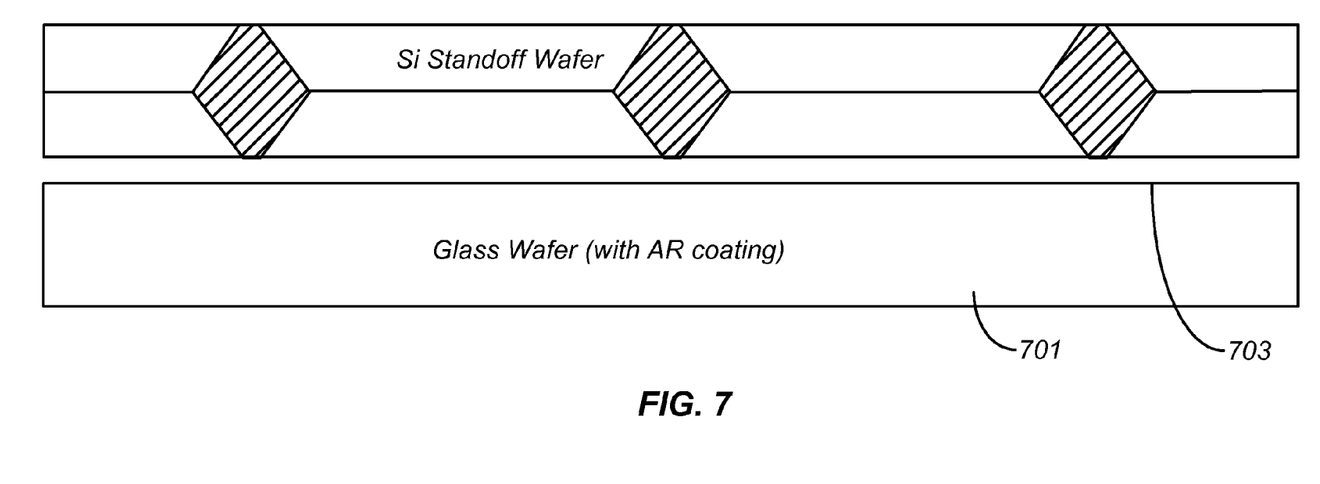

The method initiates a bond between a first face of the first surface region of the patterned silicon substrate to a handle substrate 701, as illustrated by FIG. 7. As shown, a face 703 of the handle substrate is positioned facing the patterned silicon substrate. Preferably, the handle substrate is a glass substrate and optically transparent. Preferably, the handle substrate includes an overlying antireflective coating overlying surface region 703. The antireflective coating can be a suitable material such as magnesium di-fluoride, or other suitable materials, including more than one layer of materials, which are selectively provided to reduce reflection of a certain wavelength of electromagnetic radiation. Of course, one of ordinary skill in the art would recognize many variations, modifications, and alternatives.

Optionally, each of the faces being bonded to each other is subjected to a pre-bond treatment. The pre-bond treatment can include a cleaning and/or activation process of surfaces to be bonded to each other. The cleaning process can include conventional cleans such as those commonly called "RCA" clean, among plasma activated cleaning and/or treatment processes. Bonding occurs via hermetic bonding techniques or non-hermetic bonding techniques or combinations of these, depending upon the specific embodiment. The hermetic techniques include, among others, anodic, eutectic, fusion, covalent, glass frit, spin on glass, etc. The non-hermetic techniques including, among others, epoxy, glue layers, polymer based adhesives, BCB adhesive manufactured by Dow Corning Corporation, any combination of these, and other suitable materials. Of course, one of ordinary skill in the art would recognize many other variations, modifications, and alternatives.

Figure 8:
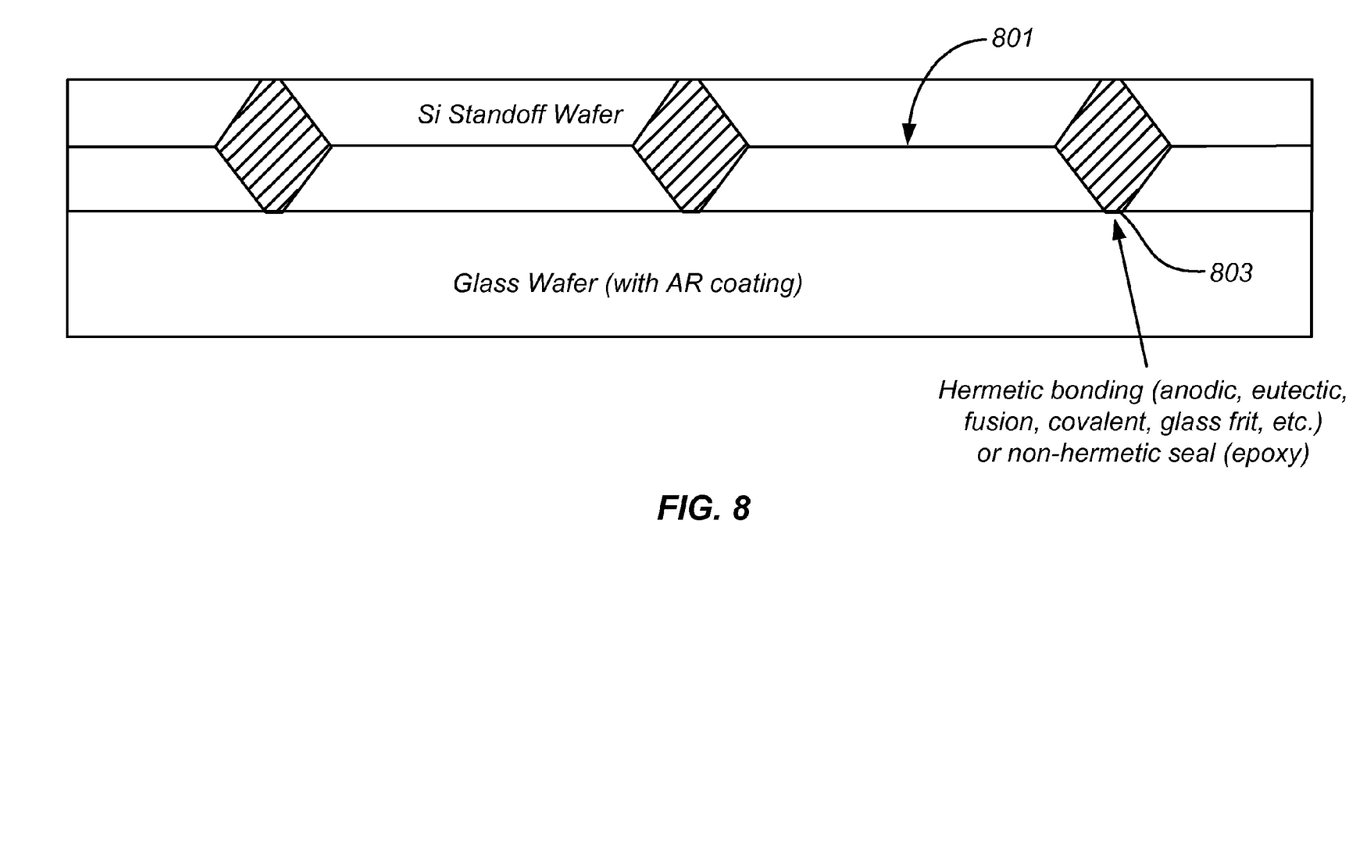
Figure 9:
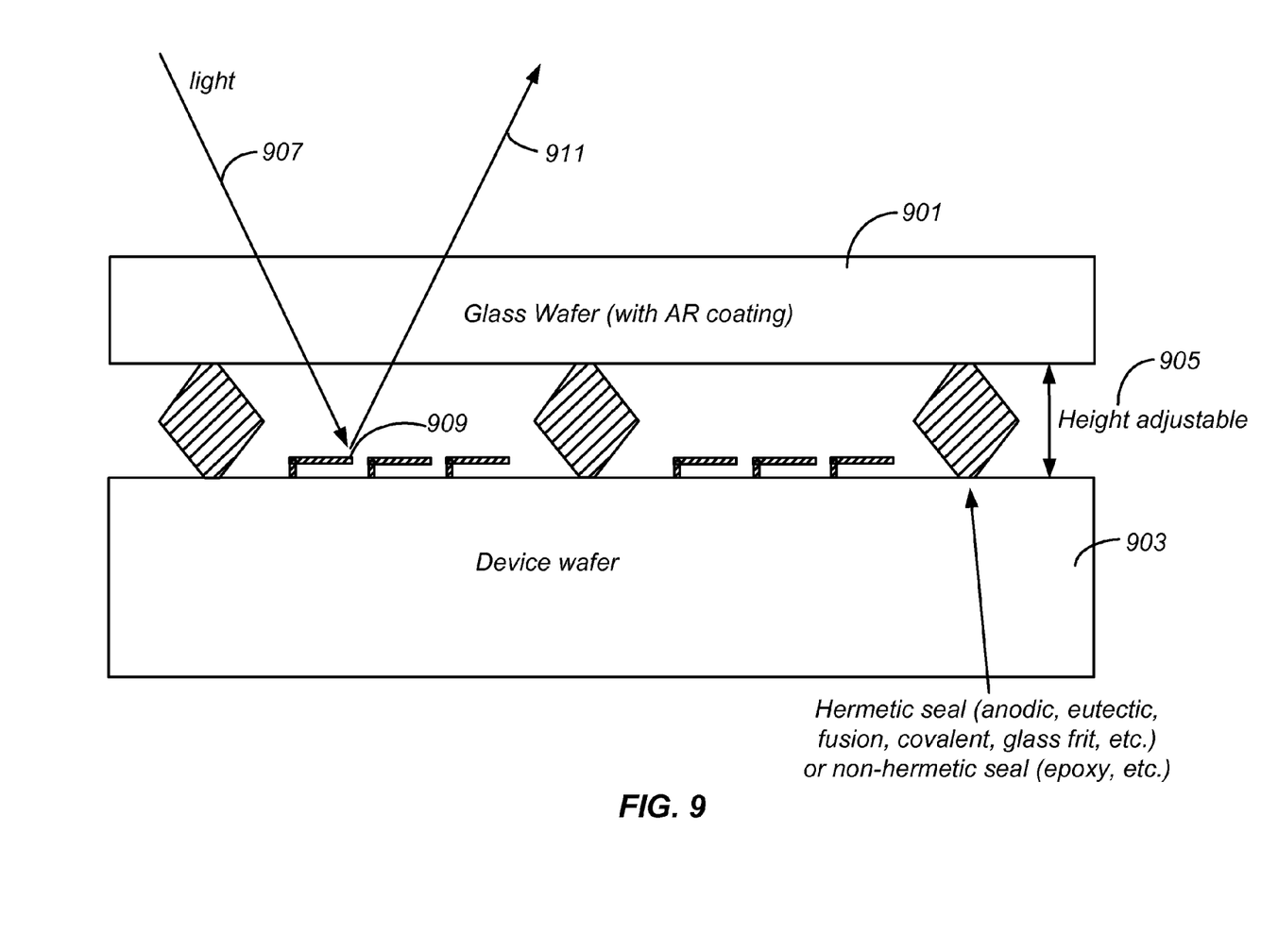

Referring to FIG. 8, the method forms a plurality of recessed regions defined respectively by the plurality of openings. Each of the plurality of recessed regions has a portion of the handle substrate acting as a border region. Referring now to FIG. 9, the method includes bonding a second face of the second surface region of the patterned silicon substrate 901 to a device substrate 903. Each of the recessed regions faces at least one chip to enclose the chip with a portion of the patterned silicon substrate. Preferably, the device substrate comprises a plurality of micro-mirror structures or other like structures. Each of the micro-mirror structures is aligned to each of the regions previously occupied by a recessed region, as also shown. Light 907 traverses through the handle substrate, which has antireflective coatings, reflects off of optical deflection device 909, and traverses back 911 through a portion of the handle substrate. Bonding the standoff structures to the device substrate can be achieved through hermetic sealing techniques. Such techniques include, among others, anodic, eutectic, fusion, covalent, glass frit, etc. Other techniques such as non-hermetic seals can also be used. Such non-hermetic seals use epoxy, glue layers, or others mentioned above, among others. Of course, one of ordinary skill in the art would recognize many other variations, modifications, and alternatives.

In a specific embodiment, the present method also adjusts a height 905 between the face of the handle substrate and a face of the device substrate. The height can be adjusted via polishing and/or planarizing techniques of the standoff regions. Preferably, the height is provided a selected dimension for the application according to an embodiment of the present invention. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming patterned silicon materials, the method comprising:
   providing a silicon substrate having a first surface region and a second surface region, a thickness of material defined between the first surface region and the second surface region;
   protecting first selected regions on the first surface region using a first masking layer;
   protecting second selected regions using a second masking layer, facing the first selected regions, on the second surface region;
   removing first unprotected regions on the first surface and removing second unprotected regions on the second surface to cause removal of a portion the thickness of material in the first unprotected regions and the second unprotected regions to form a plurality of openings through the thickness of material defined between the first surface region and the second surface region, wherein the plurality of openings are formed in the first unprotected regions and the second unprotected regions;
   removing the first masking layer;
   removing the second masking layer to form a patterned silicon substrate; and
   bonding the patterned silicon substrate to a handle substrate.

2. The method of claim 1 wherein the removing the first unprotected regions and the removing the second unprotected regions are performed simultaneously.

3. The method of claim 2 wherein the removing the first unprotected regions and the removing the second unprotected regions are provided using a wet etching process.

4. The method of claim 1 wherein the handle substrate is a glass substrate.

5. The method of claim 4 further comprising bonding the patterned silicon substrate with the glass substrate to a device substrate.

6. The method of claim 5 wherein the device substrate comprises a plurality of micro-mirror devices.

7. The method of claim 1 wherein the first masking layer and the second masking layer comprise a nitride bearing material.

8. The method of claim 1 wherein the first masking layer and the second masking layer comprises a thermal oxide material.

9. The method of claim 1 wherein the patterned silicon substrate comprises waffle structure.

10. The method of claim 1 wherein the plurality of openings are provided in the first unprotected regions to the second unprotected regions.

11. A method for forming patterned silicon materials, the method comprising:
    providing a silicon substrate having a first surface region and a second surface region, a thickness of material defined between the first surface region and the second surface region;
    protecting first selected regions on the first surface region using a first masking layer;
    protecting second selected regions using a second masking layer, facing the first selected regions, on the second surface region;
    removing first unprotected regions on the first surface and removing second unprotected regions on the second surface;
    causing removal of a portion through the thickness of material in the first unprotected regions and the second unprotected regions to form a plurality of openings formed in the first unprotected regions and the second unprotected regions;
    removing the first masking layer;
    removing the second masking layer to form a patterned silicon substrate;
    bonding a first face of the first surface region of the patterned silicon substrate to a handle substrate to for a plurality of recessed regions defined respectively by the plurality of openings, each of the plurality of recessed regions having a portion of the handle substrate acting as a border region; and
    bonding a second face of the second surface region of the patterned silicon substrate to a device substrate;
    whereupon each of the recessed regions faces at least one chip to enclose the chip with a portion of the patterned silicon substrate.

12. The method of claim 11 wherein the removing the first unprotected regions and the removing the second unprotected regions are performed simultaneously.

13. The method of claim 12 wherein the removing the first unprotected regions and the removing the second unprotected regions are provided using a wet etching process and/or dry etching process.

14. The method of claim 11 wherein the handle substrate is a glass substrate.

15. The method of claim 14 wherein the device substrate is bonded by a hermetic or non-hermetic process.

16. The method of claim 15 wherein the device substrate comprises a plurality of micro-mirror devices.

17. The method of claim 11 wherein the first masking layer and the second masking layer comprise a nitride bearing material.

18. The method of claim 11 wherein the first masking layer and the second masking layer comprises a thermal oxide material.

19. The method of claim 11 wherein the patterned silicon substrate comprises waffle structure.

20. A method for forming a standoff structure for packaging devices, the method comprising:
    providing a substrate, the substrate including a first surface region, a second surface region, and a thickness defined between the first surface region and the second surface region;
    protecting selected portions of the first surface region using a masking layer while leaving a plurality of unprotected regions, each of the unprotected region to be associated with an opening through the thickness of the substrate;
    causing removal of the plurality of unprotected regions to form a plurality of openings through the thickness of the substrate to provide a resulting patterned substrate, each of the openings being bordered by a portion of the selected portions of the first surface region; and
    removing the masking layer.

21. The method of claim 20 further comprising bonding a handle substrate to the patterned substrate, the handle substrate being transparent, each of the openings being bordered by a portion of the handle substrate to form a recessed region.

22. The method of claim 20 wherein each of the plurality of openings is defined by an angle of about 54.74 Degrees from a surface region of the substrate to an interior region of the opening.

23. The method of claim 22 wherein the angle facilitates a subsequent bonding process, the bonding process being free from any breakage of an inner portion of at least one of the openings.

24. The method of claim 20 further comprising bonding a device substrate to the patterned substrate, wherein the device substrate comprises a plurality of micro-mirror devices.

25. The method of claim 24 wherein the handle substrate comprises a glass substrate.

26. The method of claim 20 wherein the plurality of openings through the thickness of the substrate connect the first surface region and the second surface region.

* * * * *